(12) United States Patent
Seng

(10) Patent No.: US 10,116,151 B2
(45) Date of Patent: Oct. 30, 2018

(54) BATTERY CHARGER RENTAL KIOSK SYSTEM

(71) Applicant: BSENG, LLC, Satellite Beach, FL (US)

(72) Inventor: Borey Seng, Satellite Beach, FL (US)

(73) Assignee: BSENG, LLC, Satellite Beach, FL (US)

( * ) Notice: Subject to any disclaimer, the term of this patent is extended or adjusted under 35 U.S.C. 154(b) by 259 days.

(21) Appl. No.: 15/273,441

(22) Filed: Sep. 22, 2016

(65) Prior Publication Data

US 2017/0085103 A1   Mar. 23, 2017

Related U.S. Application Data

(60) Provisional application No. 62/221,990, filed on Sep. 22, 2015.

(51) Int. Cl.
| | |
|---|---|
| *H02J 7/00* | (2006.01) |
| *H05K 5/00* | (2006.01) |
| *G06Q 30/00* | (2012.01) |
| *H01R 31/00* | (2006.01) |
| *H05K 5/02* | (2006.01) |
| *G06Q 30/06* | (2012.01) |
| *H01R 31/06* | (2006.01) |

(52) U.S. Cl.
CPC .......... *H02J 7/0042* (2013.01); *H02J 7/0047* (2013.01); *H02J 7/0052* (2013.01); *H02J 7/0054* (2013.01); *H05K 5/0278* (2013.01); *G06Q 30/0645* (2013.01); *H01R 31/065* (2013.01); *H02J 2007/0062* (2013.01)

(58) Field of Classification Search
CPC ...... H02J 7/0042; H02J 7/0047; H02J 7/0052; H02J 7/0054; H02J 2007/0062; H05K 5/0278; G06Q 30/0645; H01R 31/065
USPC ........................................ 320/107, 112, 110
See application file for complete search history.

(56) References Cited

U.S. PATENT DOCUMENTS 5,159,560 A   10/1992  Newell et al.
5,813,111 A *  9/1998  Maejima ................ H01R 43/20
                                                       29/748

(Continued)

FOREIGN PATENT DOCUMENTS

JP        2002141038 A  *  5/2002

OTHER PUBLICATIONS

Li, Chinese Patent Document No. CN-204311862-U, published May 6, 2015, abstract and 1 drawing sheet, 3 pages.*

*Primary Examiner* — Phallaka Kik
(74) *Attorney, Agent, or Firm* — Kelly G. Swartz; Widerman Malek, PL

(57) ABSTRACT

A battery pack device including a housing, a plurality of electrical contacts, a plurality of electrical connectors, a moveable control device, and a battery. The housing may have a chamfered edge. The plurality of electrical contacts may be carried by an outer surface of the housing. The plurality of electrical connectors may be carried within the housing. The moveable control device may be adapted to position at least one of the plurality of electrical connectors through an aperture located in the housing when activated. The battery may be contained within the housing and in electrical communication with each of the plurality of electrical connectors and the plurality of electrical contacts.

20 Claims, 8 Drawing Sheets

(56) References Cited

U.S. PATENT DOCUMENTS

| | | | | |
|---|---|---|---|---|
| 6,597,154 B2* | 7/2003 | Foch | | H02J 9/06 |
| | | | | 323/205 |
| 7,192,295 B1* | 3/2007 | Yeh | | H01R 13/6275 |
| | | | | 439/350 |
| 7,431,595 B1* | 10/2008 | Yen | | G06K 7/0021 |
| | | | | 439/138 |
| 7,444,296 B1 | 10/2008 | Barber et al. | | |
| 7,938,660 B1* | 5/2011 | Beak | | H01R 13/701 |
| | | | | 439/269.1 |
| 8,498,737 B2 | 7/2013 | Yepez | | |
| 8,587,407 B2 | 11/2013 | Claessen | | |
| 9,056,555 B1* | 6/2015 | Zhou | | B60L 11/1827 |
| 2002/0071255 A1* | 6/2002 | Centola | | H05K 7/1407 |
| | | | | 361/759 |
| 2007/0300288 A1* | 12/2007 | Choi | | H01R 13/639 |
| | | | | 726/2 |
| 2008/0121699 A1 | 5/2008 | Thorsen et al. | | |
| 2008/0207031 A1* | 8/2008 | Chen | | H01R 24/84 |
| | | | | 439/256 |
| 2009/0077497 A1* | 3/2009 | Cho | | G06F 3/04817 |
| | | | | 715/814 |
| 2011/0194248 A1* | 8/2011 | Nakasaka | | H01L 23/473 |
| | | | | 361/689 |
| 2012/0127307 A1 | 5/2012 | Hassenzahl | | |
| 2012/0271453 A1 | 10/2012 | Alvarez | | |
| 2013/0106344 A1* | 5/2013 | Amero, Jr. | | H02J 7/0042 |
| | | | | 320/107 |
| 2013/0184856 A1 | 7/2013 | Gregerson | | |
| 2014/0127924 A1* | 5/2014 | Kim | | H01R 13/62933 |
| | | | | 439/299 |
| 2014/0368156 A1 | 12/2014 | Aloe | | |
| 2015/0222743 A1* | 8/2015 | Lee | | H04M 1/72577 |
| | | | | 455/566 |
| 2015/0358579 A1* | 12/2015 | Shin | | H04R 1/406 |
| | | | | 348/14.16 |

* cited by examiner

BATTERY CHARGER RENTAL KIOSK SYSTEM

RELATED APPLICATIONS

This application claims the benefit under 35 U.S.C. § 119(e) of U.S. Provisional Patent Application Ser. No. 62/221,990 filed Sep. 22, 2015. The contents of which are incorporated herein in their entirety.

FIELD OF THE INVENTION

The present invention relates to the field of rental kiosks and, more specifically, to systems and methods for dispensing, collecting, and charging battery charging devices.

BACKGROUND

Portable handheld electronics have become ubiquitous in our daily lives. Heavy usage and reliance on these devices drains powered from the on board batteries of the devices. Portable handheld electronics manufacturers have responded to the power demands of consumers by designing devices with lower power demands and longer battery life. Nevertheless, depleting a device's battery store and subsequently being able to not use the device until the battery is recharged remains a problem. A need exists for a charging system to supply power to these devices on demand when the device user may not be able to connect the device to a traditional charging device plugged into a wall outlet.

This background information is provided to reveal information believed by the applicant to be of possible relevance to the present invention. No admission is necessarily intended, nor should be construed, that any of the preceding information constitutes prior art against the present invention.

SUMMARY OF THE INVENTION

With the above in mind, embodiments of the present invention are related to a battery pack device including a housing, a plurality of electrical contacts, a plurality of electrical connectors, a moveable control device, and a battery. The housing may have a chamfered edge. The plurality of electrical contacts may be carried by an outer surface of the housing. The plurality of electrical connectors may be carried within the housing. The moveable control device may be adapted to position at least one of the plurality of electrical connectors through an aperture located in the housing when activated. The battery may be contained within the housing and in electrical communication with each of the plurality of electrical connectors and the plurality of electrical contacts.

The device may include a plurality of torsion springs wherein each torsion spring is secured to a respective one of the plurality of electrical connectors and adapted to rotate the respective electrical connector through the aperture when the moveable control device is activated to release the torsion spring.

The moveable control device may be further adapted to capture at least one of the torsion springs and retain the respective electrical connector within the housing when deactivated.

The device may include a linear spring adapted to maintain the moveable control device in a deactivated position when the linear spring is uncompressed.

The device may include a circuit board, which may include a first set of traces and a second set of traces. The first set of traces may be in electrical communication with at least two of the plurality of electrical contacts and the battery. The second set of traces may be in electrical communication with the battery and each of the plurality of electrical connectors.

The device may include a charging connector secured to the housing and in electrical communication with the battery.

The device may include an identification component secured to the housing and adapted to provide identifying information to a kiosk.

The device may include a charge level circuit adapted to generate a signal indicative of a charge level of the battery and provide the signal to the plurality of electrical contacts.

The device may include a variable power supply circuit adapted to provide a variable current level and a variable voltage level to each of the plurality of electrical connectors.

The plurality of electrical connectors may include a Lightning connector, a micro-USB connector, and a 30-pin connector.

The device may include a light emitter adapted to indicate a charge level of the battery.

DETAILED DESCRIPTION OF THE INVENTION

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Those of ordinary skill in the art realize that the following descriptions of the embodiments of the present invention are illustrative and are not intended to be limiting in any way. Other embodiments of the present invention will readily suggest themselves to such skilled persons having the benefit of this disclosure. Like numbers refer to like elements throughout.

Although the following detailed description contains many specifics for the purposes of illustration, anyone of ordinary skill in the art will appreciate that many variations and alterations to the following details are within the scope of the invention. Accordingly, the following embodiments of the invention are set forth without any loss of generality to, and without imposing limitations upon, the claimed invention.

In this detailed description of the present invention, a person skilled in the art should note that directional terms, such as "above," "below," "upper," "lower," and other like terms are used for the convenience of the reader in reference to the drawings. Also, a person skilled in the art should notice this description may contain other terminology to convey position, orientation, and direction without departing from the principles of the present invention.

Furthermore, in this detailed description, a person skilled in the art should note that quantitative qualifying terms such as "generally," "substantially," "mostly," and other terms are used, in general, to mean that the referred to object, characteristic, or quality constitutes a majority of the subject of the reference. The meaning of any of these terms is dependent upon the context within which it is used, and the meaning may be expressly modified.

Figure 1:
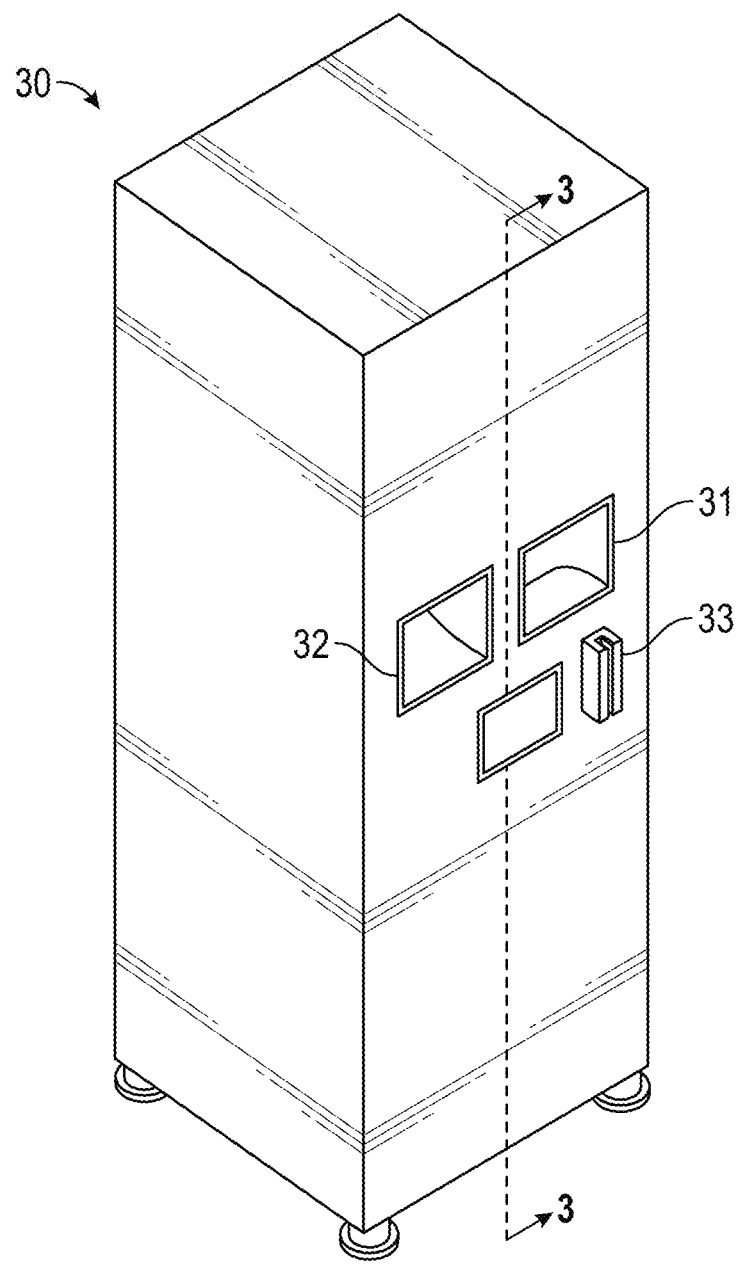
FIG. 1 is a perspective view of the battery pack dispensing unit of the battery pack dispensing system according to one embodiment of the present invention.
Figure 3:
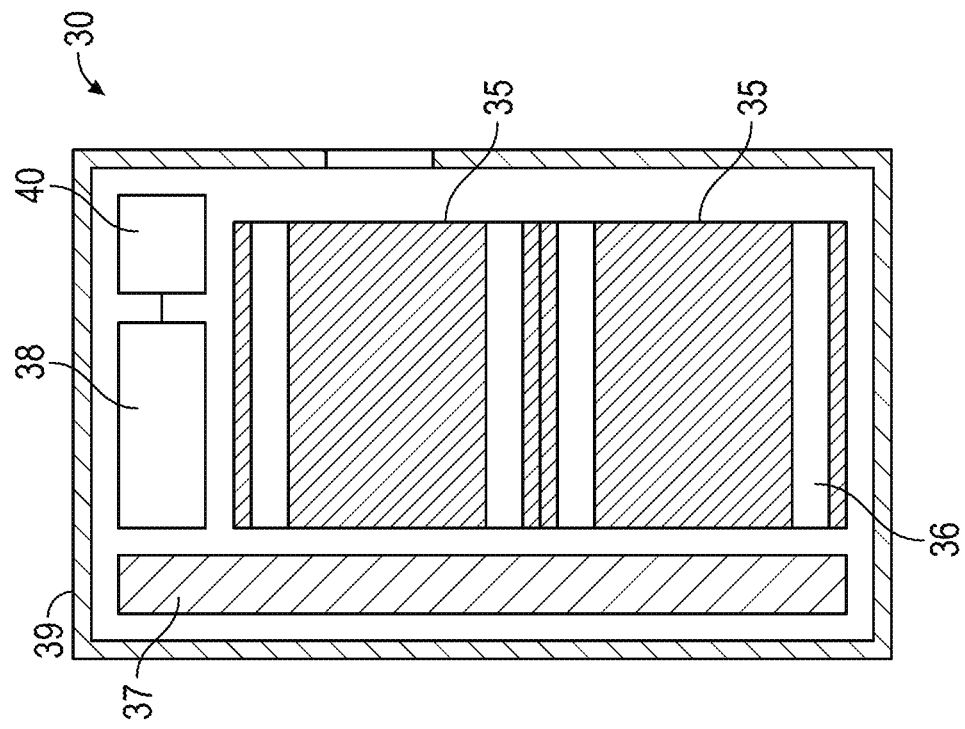
FIG. 3 is a cross section view of the battery pack dispensing unit along the 3-3 line of FIG. 1.

An embodiment of the invention, as shown and described by the various figures and accompanying text provides apparatus, systems, and methods for renting battery packs or the like. Turning to FIG. 1, a battery pack dispensing unit 30 is depicted. The battery pack dispensing unit 30 may be utilized by a user desiring to rent or utilize a battery pack. Battery packs may be used to charge or power a phone, tablet, laptop, handheld gaming device, camera, another portable electronic device, or the like. The user may rent the battery pack for a predetermined duration and return the device to the battery pack dispensing unit 30 when done. The user may be charged an additional fee for exceeding the predetermined duration. The fee paid by the user may be based on the milliamp hours provided by the battery pack. The available milliamp hours may be determined based on the capability of the battery pack. The available milliamp hours may be determined based on the charge level of the battery pack at the time of rental or at the time of dispensing the battery pack. The fee paid by the user may also, or in combination, be based on the type of battery pack rented. The user may be charged a maximum, predetermined fee if the battery pack is not returned within a given amount of time.

The battery pack dispensing unit 30 may be accompanied by a user interface stand 41. A single battery pack dispensing unit 30 may be used in conjunction with a plurality of user interface stands 41. By way of example, and not as a limitation, user interface stands 41 may be placed in multiple locations in proximity to a single battery pack dispensing unit 30. Again by way of example, and not as a limitation, the user interface stands 41 or battery pack dispensing unit 30 may be placed in a mall, event venue, airport, theme park, or the like.

The charge level of the battery pack may be measured in milliamp hours. A fully charged battery pack may contain more milliamp hours than a lesser charged battery pack. A higher fee may be charged for a more fully charged battery pack. Further, the battery pack dispensing unit 30 may provide a user with an option to search its inventory for battery packs based on amount of charge.

Each battery pack may contain more than one connector. Such a configuration may allow each battery pack to be used with a plurality of devices. The fee charged for the battery pack may vary dependent upon the connector or connectors associated with the pack.

In one embodiment, the battery pack dispensing unit 30 may contain a plurality of types of battery packs. Different types of battery packs may have different connectors and work with different electronic devices. Different types of battery packs may have different milliamp hour storage capabilities. The user may be charged different amounts based upon the type of battery pack the user borrows from the battery pack dispensing unit 30. Similarly, the battery pack dispensing unit 30 or user interface stand 41 may provide the user with the ability to search for various types of battery packs.

The battery pack dispensing unit 30 may be an automated kiosk housing a battery pack receiver opening 31, battery pack dispenser opening 32, a plurality of battery packs, a wireless charging pad 37, and one or more device holders 35. The battery pack receiver opening 31 may be an opening in the battery pack dispensing unit 30. The battery pack receiver opening 31 may be sized to accept a battery pack. The battery pack receiver opening 31 may be configured to accept a battery pack in only one orientation. The battery pack dispensing unit 30 may be used in conjunction with battery packs configured for use with the battery pack dispensing unit 30. Such battery packs 50 may have a non-symmetric configuration. The configuration of the battery pack 50 may enable the battery pack 50 to be inserted in the battery pack receiver opening 31 in only a single orientation. This may enable a coil in the battery pack 50 to properly align with a charging device within the battery pack dispensing unit 30 once the battery pack 50 is moved into the battery pack dispensing unit 30.

The battery pack receiver opening 31 may be configured with an access door disposed across the battery pack receiver opening 31. The access door may open to allow a battery pack to enter the battery pack dispensing unit 30. The access door may be configured to open only when a battery pack is detected. The battery pack may be detected using an identifier associated with a battery pack. The identifier may be an RFID, other wireless signal, signature inductance, or the like. The identifier may be the detected weight, shape, size, or the like of the battery pack.

The battery pack dispensing unit 30 may have a battery pack dispenser opening 32. The battery pack may be dispensed from the battery pack dispensing unit 30 to a user through the battery pack dispenser opening 32. In some embodiments, the battery pack may be dispensed from and received by a single opening. The battery pack receiver opening 31 or the battery pack dispenser opening 32 may be covered by a movable door. The door may be opened to allow a user to place or remove a battery pack into or from the battery pack dispensing unit 30. The door may automatically open to allow a user to remove or place a battery pack.

In some embodiments the battery pack dispensing unit 30 may include an identifier module 33. The identifier module 33 may accept an identifying device. The identifying device may be a credit card, RFID, other physical device, or the like. In some embodiments the identifying device may be dispensed by a user interface stand 41. The dispensing identifier module 33 may detect the identifying device. The detection of the identifying device may direct the battery pack dispensing unit 30 to dispense a particular battery pack or a battery pack embodying specific characteristics. The battery pack dispensed by the battery pack dispensing unit 30 may be a battery pack selected by the user utilizing the user interface stand 41 and associated with the identifying device provided to the dispensing identifier module 33.

A wireless charging pad 37 may be disposed within the battery pack dispensing unit 30. Battery packs in proximity to the wireless charging pad 37 may be charged through inductance or other means.

In one embodiment, one or more device holders 35 may be disposed within the battery pack dispensing unit 30. Each device holder 35 may have one or more compartments 36. Each compartment 36 may hold a battery pack. The device holders 35 may be configured to move with respect to the battery pack dispenser opening 32 or the battery pack receiver opening 31. The device holders 35 may be configured in arrangement that allows each compartment 36 to be moved into a position to accept a battery pack from the battery pack receiver opening 31. The device holders 35 may be configured in arrangement that allows each compartment to be moved into a position to provide a battery pack to the battery pack dispenser opening 32.

Figure 2:
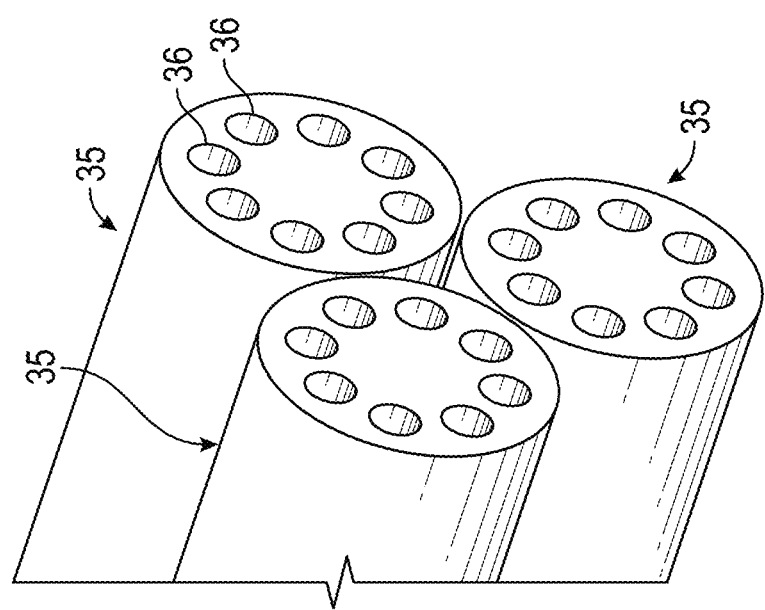
FIG. 2 is a perspective view of device holders of the battery pack dispensing unit of FIG. 1.
Figure 4:
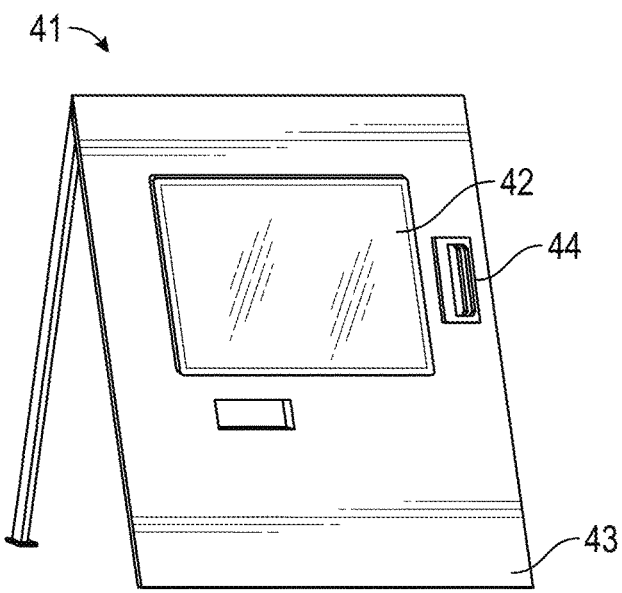
FIG. 4 is a perspective view of a user interface stand of the battery pack dispensing system according to one embodiment of the present invention.

As depicted in FIG. 2, there may be a plurality of device holders 35. Each device holder 35 may be cylindrical. Each device holder 35 may rotate about its longitudinal axis. The plurality of device holders 35 may rotate about a central axis. In operation, one or more device holders 35 may be positioned to place the desired compartment 36 in alignment with the battery pack receiver opening 31 or the battery pack dispenser opening 32. When the desired compartment 36 is in alignment with the desired opening 31, 32, an access door covering the opening may be opened to allow access to the compartment 36.

The device holders 35 may be capable of positioning each battery pack in front of a wireless charging pad 37. The device holders 35 may be configured to place each battery pack within the device holder 35 in front of the wireless charging pad 37 at all times. In some embodiments, the device holder 35 may be configured to place selected battery packs in front of the wireless charging pad 37. Battery packs not in need of charging may be positioned away from the wireless charging pad 37.

The battery pack dispensing unit 30 may have a mechanical control system 38. The mechanical control system 38 may have a processor. The mechanical control system 38 may monitor the location of each device holder 35 or compartment 36 with respect to the battery pack receiver opening 31 or battery pack dispenser opening 32. A logic control module 45 may be located in a cloud 47 and may utilize information provided by the user interface stand 41, Internet connected device 48, or battery pack dispensing unit 30 to determine the appropriate compartment 36 to load upon receipt of a battery pack through the battery pack receiver opening 31. Similarly, the logic control module 45 may determine the appropriate compartment 36 to align with the battery pack dispenser opening 32 upon receiving a dispensing request. The logic control module 45 may make these determinations based upon the current state of the battery packs within the battery pack dispensing unit 30. The logic control module 45 may make these determinations based upon the current location of the compartments 36 within the battery pack dispensing unit 30. The mechanical control system 38 may determine the movement of the device holder 35 necessary to align compartment 36.

In one embodiment, the logic control module 45 may direct the mechanical control system 38 to cause the device holder(s) 35 to position the compartment 36 containing the most fully charged battery pack proximate the battery pack dispenser opening 32 upon receiving a dispensing request. Likewise, the logic control module 45 may direct the device holder(s) 35 to position an open compartment proximate to the battery pack receiver opening 31.

In one embodiment, the user of the battery pack may request a battery pack that is less than fully charged. In such an embodiment, the user may pay a reduced rate for use of the battery pack when the battery pack is less than fully charged. The battery pack dispensing unit 30, internet connected device 48, or user interface stand 41 may provide the user with an option to choose a less than fully charged battery pack. Such an option may be accompanied with an offer for a reduced rate.

The logic control module 45 may ensure that a first device holder 35 is fully loaded before utilizing compartments 36 in a second device holder 35. The logic control module 45 may direct loading and unloading of the compartments 36 in a manner that maximizes distribution of battery packs between all device holders 35. The logic control module 45 may direct loading and unloading of the compartments 36 in a manner that minimizes movement of the device holders 35. The logic control module 45 may direct a compartment 36 with a fully charged battery pack to be positioned in front of the battery pack dispenser opening 32 in anticipation of receiving a dispense request. The logic control module 45 may direct an empty compartment 36 to be positioned in front of the battery pack receiver opening 31 in anticipation of receiving a returned battery pack.

The kiosk 39 may have a transceiver 40 to communicate with a remote user interface stand 41 or the cloud 47. The transceiver 40 may allow the kiosk 39 to communicate with the cloud 47. The transceiver 40 may communicate with the logic control module 45 on the cloud 47. Users may provide information to the logic control module 45 using the user interface stand 41 or the internet connected device 48. The logic control module 45 may receive information from users indicating their intent to receive a battery pack from the battery pack dispensing unit 30 or return a battery pack to the battery pack dispensing unit 30. With embodiments utilizing a user interface stand 41, a user may select the desired battery pack or initiate a battery pack rental transaction through the user interface stand 41. The logic control module 45 may determine the location of convenient battery pack dispensing units 30 based on the location from which the user submits a request. Convenient battery pack dispensing units 30 may be determined to be one or more battery pack dispensing units 30 located proximate the user.

Figure 5:
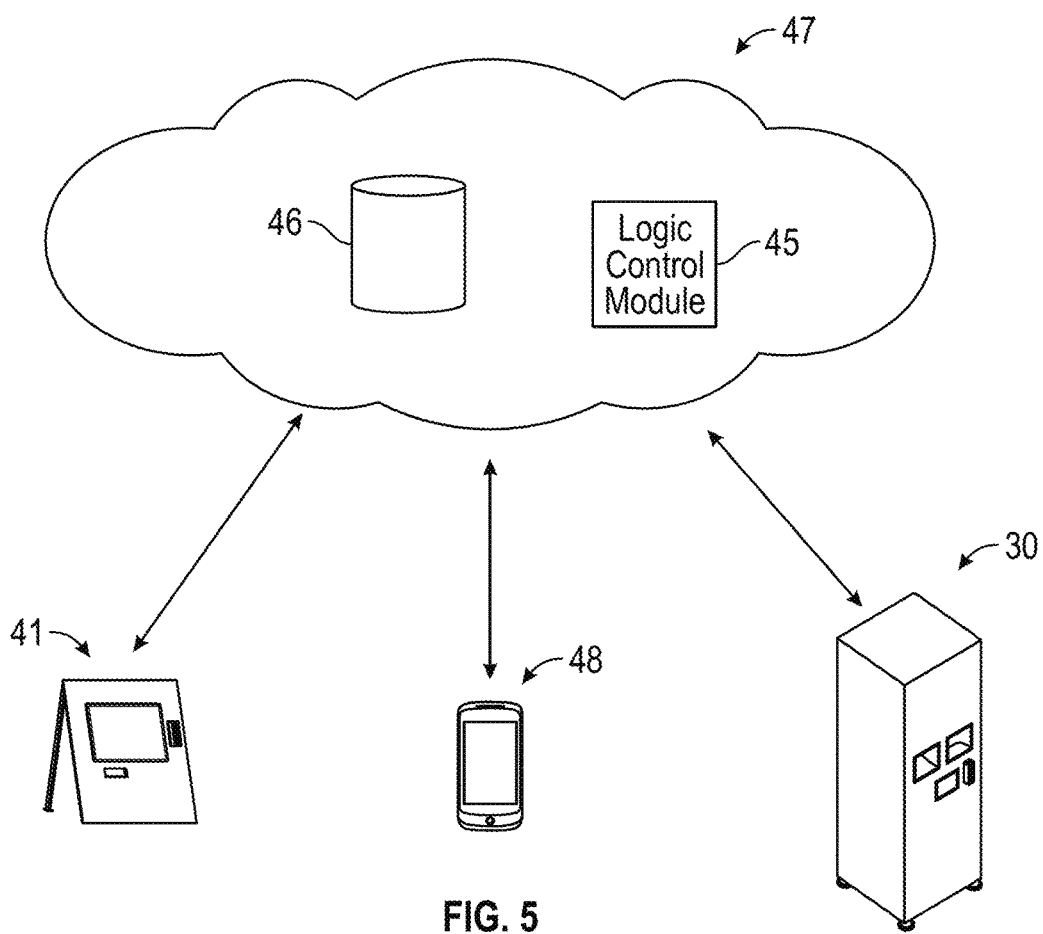
FIG. 5 is a block diagram of the system architecture of the battery pack dispensing system according to one embodiment of the present invention.
Figure 6:
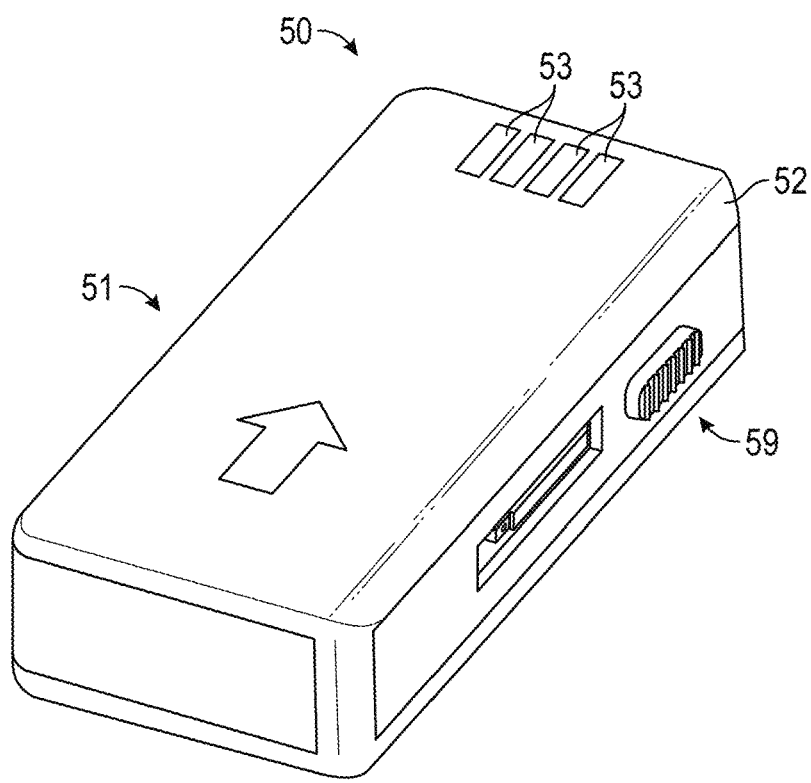
FIG. 6 is a side perspective view of the battery pack according to one embodiment of the present invention.
Figure 7:
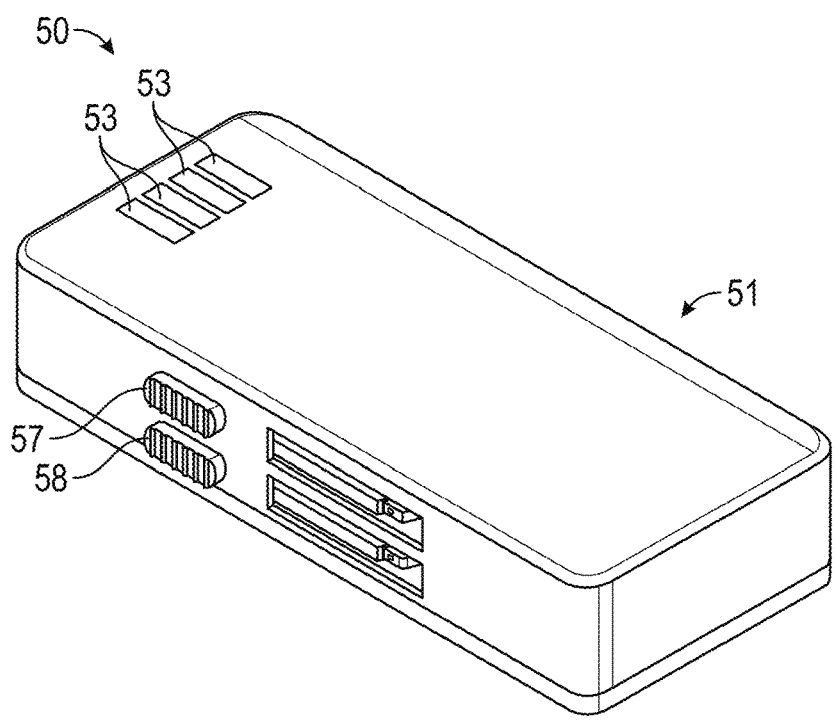
FIG. 7 is an opposing side perspective view of the battery pack of FIG. 6.
Figure 8:
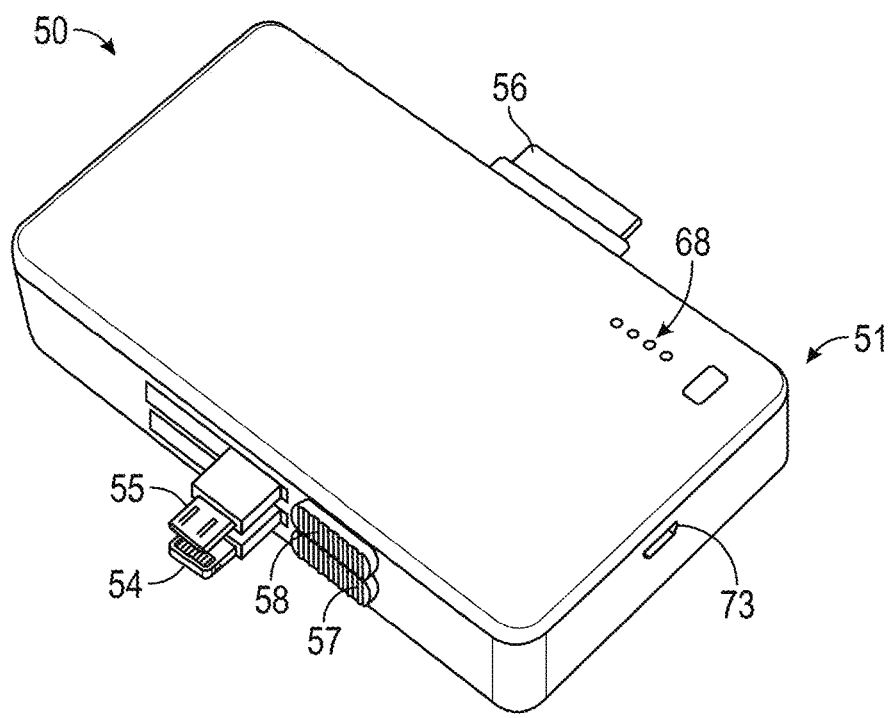
FIG. 8 is a top perspective view of the battery pack of FIG. 6.
Figure 9:
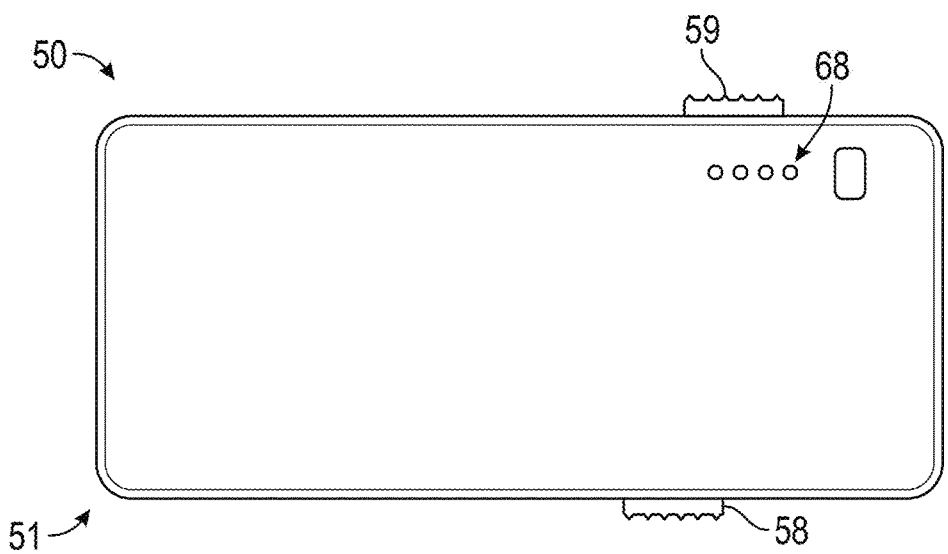
FIG. 9 is a top plan view of the battery pack of FIG. 6.
Figure 10:
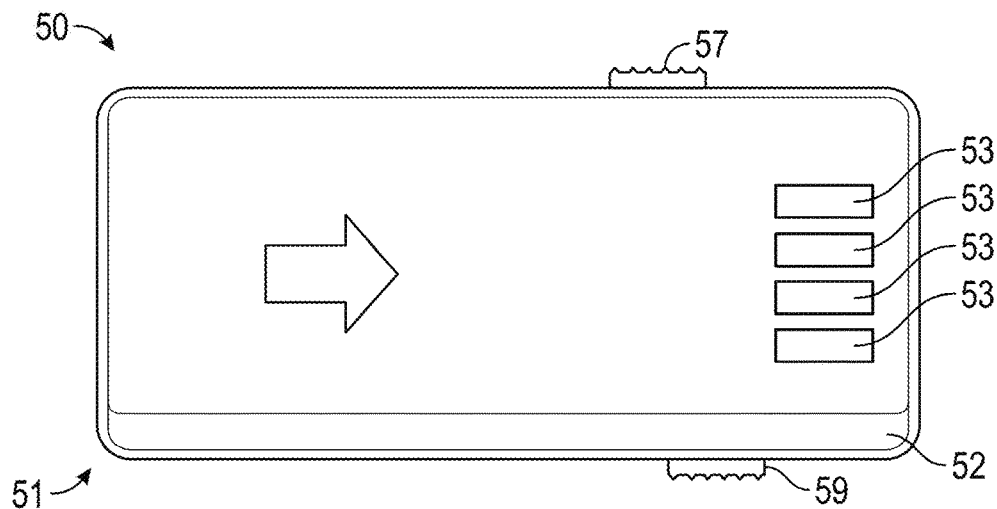
FIG. 10 is a bottom plan view of the battery pack of FIG. 6.
Figure 11:
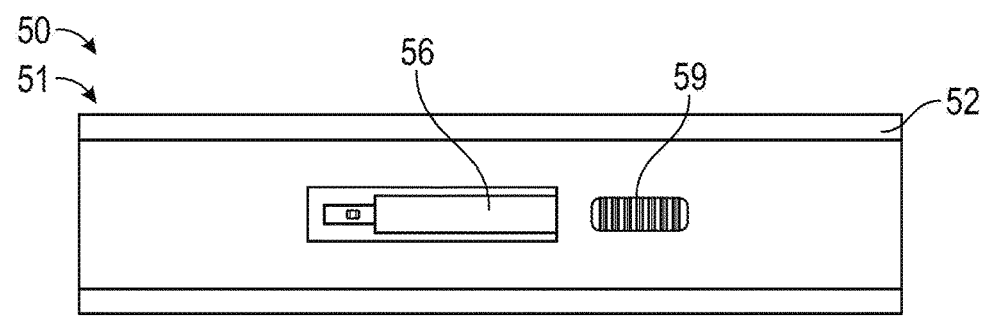
FIG. 11 is a side elevation view of the battery pack of FIG. 6.
Figure 12:
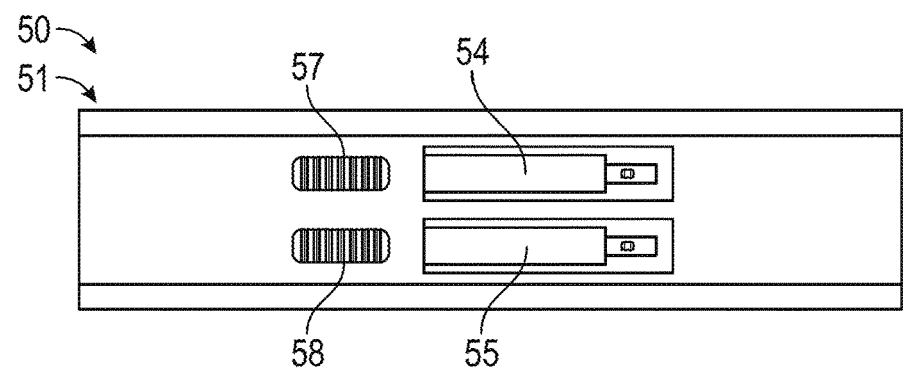
FIG. 12 is an opposing side elevation view of the battery pack of FIG. 6.
Figure 13:
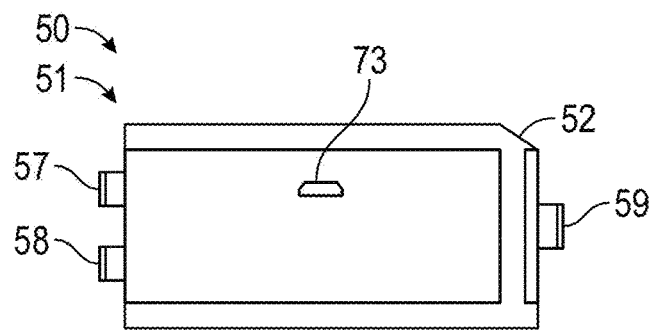
FIG. 13 is a front elevation view of the battery pack of FIG. 6.
Figure 14:
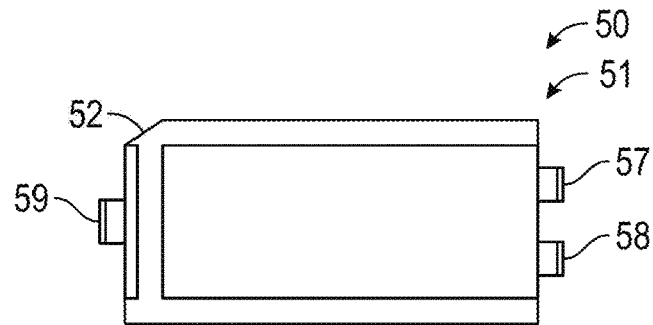
FIG. 14 is a rear elevation view of the battery pack of FIG. 6.
Figure 15:
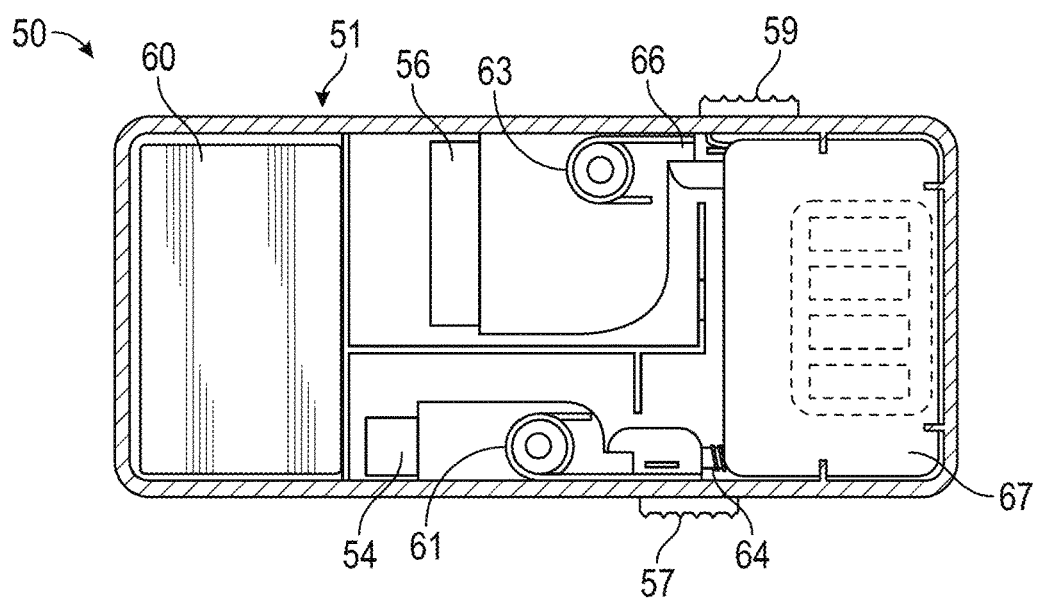
FIG. 15 is bottom plan view of the battery pack of FIG. 6 with a portion of the housing removed.
Figure 16:
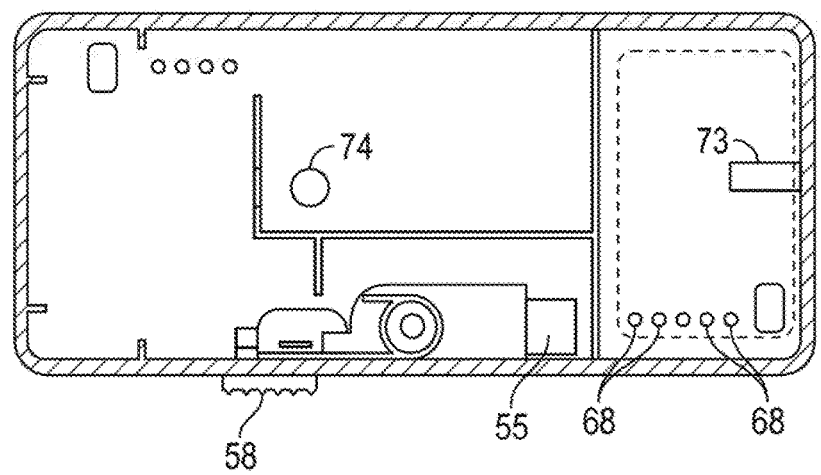
FIG. 16 is a top plan view of the battery pack of FIG. 6 with a portion of the housing removed.
Figure 17:
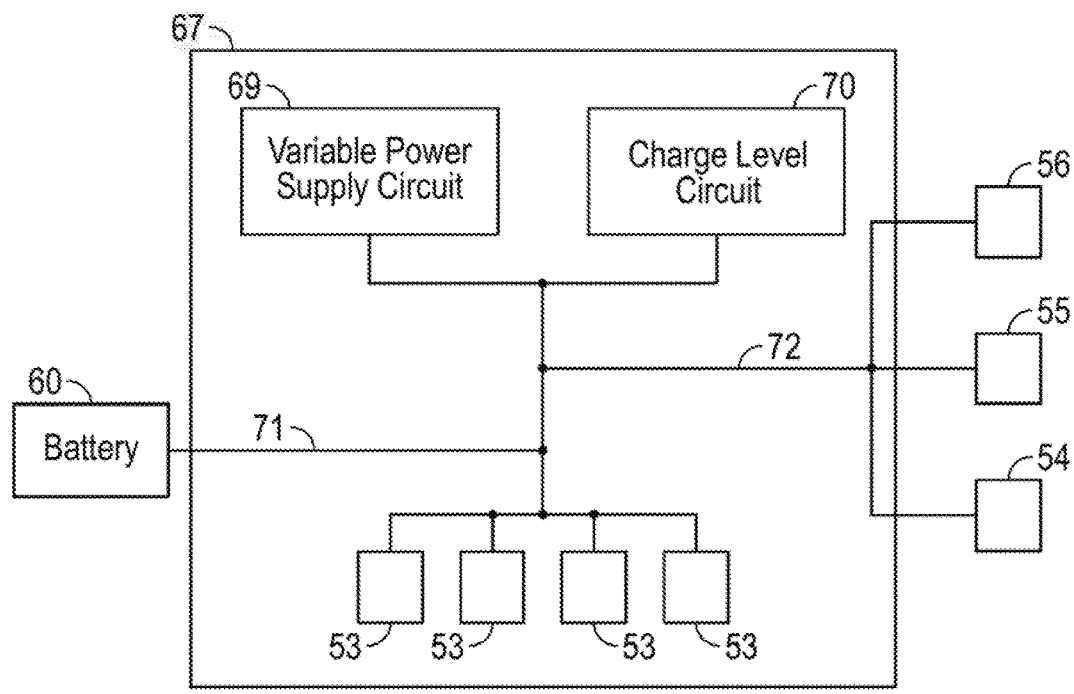
FIG. 17 is a block diagram of electronics within the battery pack according to one embodiment of the present invention.

Turning to FIG. 5, the user interface stand 41, Internet connected device 48, and battery pack dispensing unit 30 may all communicate with the cloud 47. At least one database 46 and a logic control module 45 may be located in the cloud 47. The database 46 may contain information related to the status of each battery pack within the battery pack dispensing unit 30. The database 46 may have information related to the type of battery packs in a particular battery pack dispensing unit 30, the charge level of one or more battery packs, the location of one or more battery pack dispensing units 30, the battery packs requested by one or more users, the location of one or more user interface stands 41, the expected return time of one or more battery packs, the actual return time of one or more battery packs, or the like. The logic control module 45 may determine what battery pack should be dispensed to any given user, where a battery pack should be stored in the battery pack dispensing unit 30, what battery packs may be available to any given user, the type of battery pack requested by one or more user, the location of battery pack options for any given user, or the like.

The user may utilize an Internet connected device 48 to communicate with the kiosk 39, battery pack dispensing unit 30, or user interface stand 41. Such communication may occur through the cloud 47. The user may reserve a battery pack through the Internet connected device 48. The user may enter the type of device needing to be charged. This information may be relayed to the logic control module 45. The logic control module 45 may identify a kiosk 39 or battery pack dispensing unit 30 that contains the desired battery pack and provide this information to the user. The user may include parameters related to charge left on the device to be charged, charge needed on battery pack, or final charge level of the device at the conclusion of charging to further allow the logic control module 45 to locate or reserve an appropriate battery pack. The system may automatically detect charge left on a device, the type of device to be charged, or the like. The system may utilize information known about the device to be charged to locate battery packs within one or more kiosks 39. The information related to the located battery packs, including, but not limited to, location, charge level, price, or the like, may be provided to the user to allow the user to select the desired battery pack or the desired kiosk 39 from which to obtain a battery pack.

The user interface stand 41 may be a self-contained apparatus that may be situated in a public location. The user interface stand 41 may have a battery operated tablet device 42 disposed in a support structure 43. The tablet device 42 may have a transceiver capable of communicating with the kiosk transceiver 40 or with the cloud 47. A user may interface with the tablet device 42 to select a battery pack to be dispensed from a battery pack dispensing unit 30. The user may utilize the tablet device 42 to indicate the type of battery pack that is compatible with the user's electronic device. The user may provide or select the type of electronic device need to be charged or the user may provide or select the appropriate connector to interface with the electronic device. The user may indicate the milliamp hours needed or may select the duration for which the battery pack will be utilized.

The user interface stand 41 may have a user identifier module 44. The user identifier module 44 may be a credit card reader and may be used to identify a credit card associated with the user. This credit card association may be transmitted to and utilized by the battery pack dispensing unit 30. The credit card association may be stored in a database 46 located in the cloud 47. The logic control module 45 may identify a credit card and direct the battery pack dispensing unit 30 to dispense the battery pack requested by the user associated with the credit card at user interface stand 41. The user may have the ability to purchase or rent the desired battery pack. The user may preauthorize the logic control module 45, user interface stand 41, or a database 46 to auto charge the credit card an additional amount if a predetermined duration has expired without return of the battery pack. The logic control module 45, user interface stand 41, or database 46, may auto charge the credit card with one or more additional amounts if the battery pack is not returned as anticipated. Auto charging may continue until the device is returned. In one embodiment, auto charge may cease when a predetermined amount has been charged. If a predetermined purchase price has been charged, the user may own the battery pack with no additional payments due. A lower purchase price may be paid by the user if the user agrees to purchase the battery pack from the kiosk 39 when it is originally dispensed than may be charged if the battery pack is purchased through one or more successive auto charges that occur because the battery pack has not been returned within an anticipated amount of time. A user may be given credit for a future rental or a complete or partial refund when a battery pack is returned after the anticipated amount of time and a purchase price has been charged to the user.

A user may purchase a battery pack and later return the battery pack to any battery pack dispensing unit 30 in exchange for a charged the battery pack. In one embodiment, the purchased battery pack may be exchanged for a fully charged battery pack. In another embodiment, the purchased battery pack may be exchanged for a battery pack that has the highest available charge of any option within the battery pack dispensing unit 30. This exchange service may be at full or discounted price levels in comparison to the normal operation of renting and returning battery packs.

A database 46 may be utilized to communicate or coordinate between the user interface stand 41 and the battery pack dispensing unit 30. The database may be an online database. The database 46 may be located in the cloud. By way of example, and not as a limitation, the user interface stand 41 may transmit information received from the user to the database 46. The database 46 may store this information. The database 46 may associate this information with an identifying device. The database 46 may send a request, or command, to the battery pack dispensing unit 30 which the battery pack dispensing unit 30 may receive using the transceiver 40.

By way of example, and not as a limitation, the user may approach a user interface stand 41. Utilizing the tablet device 42, a user may select the type of battery pack required and select the duration for which the battery pack will be borrowed. The user may utilize the user identifier module 44 to provide credit card information to the user interface stand 41. This credit card information may be linked to the battery pack configuration selected by the user. The information provided by the user may be stored in a database 46 on the cloud 47. The user may then approach the battery pack dispensing unit 30. The user may provide the same credit card to the dispensing identifier module 33. The information may be transmitted to the cloud 47. Upon recognition of the identifying information provided by the credit card to the battery pack dispensing unit 30, the logic control module 45 may direct the mechanical control system 38 of the battery pack dispensing unit 30 to provide the appropriate battery pack to the battery pack dispenser opening 32. When the user has completed use of the battery pack and desires to return the battery pack to the battery pack dispensing unit 30, the user may again provide the credit card to the dispensing identifier module 33 prior to returning to battery pack to the battery pack receiver opening 31.

In one embodiment, each battery pack may have a unique identifier. The battery pack dispensing unit 30 may associate each unique battery pack with the identifying information provided through the user identifier module 44. In such a configuration, the battery pack dispensing unit 30 may recognize the user to whom the battery pack was dispensed upon receipt of the battery pack through the battery pack receiver opening 31. In such an embodiment, the dispensing identifier module 33 may only be necessary during a dispensing operation. A battery pack may be returned to any battery pack dispensing unit 30 or kiosk 39. It may not be required to return the battery pack to the same battery pack dispensing unit 30 or kiosk 39 from which is was received.

In one embodiment, the user identifier module 44 may dispense a token, ticket, or the like. In embodiments in which a token is provided, the system may utilize a plurality of disparate tokens. Each token may be associated with a particular type of battery pack. The user may take the token received from the user interface stand 41 and provide it to the battery pack dispensing unit 30. Upon recognition of the token associated with a particular battery pack, the battery pack dispensing unit 30 may be directed to provide the requested battery pack to the battery pack dispenser opening 32.

In one embodiment, each token may contain identifying information that may be associated with a user or device requested by the user. The identifying information may be associated with the token in a database 46 located in the cloud 47. The token may be reusable or disposable. In embodiments in which the token is reusable, the association may be reset upon subsequent issuance of the token or receipt of the token by the battery pack dispensing unit 30.

In one embodiment, the user identifier module 44 may provide a ticket to the user. In such an embodiment, the ticket may contain a bar code, OR code, or the like as a unique identifier. The unique identifier contained on the ticket may be associated with the battery pack desired by the user or with the user. Upon presentation of the ticket to the dispensing identifier module 33, the dispensing identifier module 33 may recognize the unique identifier and utilize the control system 38 to determine the desired battery pack associated with the unique identifier. The desired battery pack may then be provided to the battery pack dispenser opening 32. The dispensed battery pack may be associated with the particular user to whom it was dispensed.

Each token or ticket dispensed by the user interface stand 41 may be associated with a particular user. The identifying information associated with the token or user may be stored in a database 46 located in the cloud 47. In such an embodiment, the battery pack dispensing unit 30 may utilize the user information provided by the token and associate identifying information related to the battery pack dispensed to that user. Upon receipt of the battery pack by a battery pack dispensing unit 30 at the conclusion of a rental term, the battery pack dispensing unit 30 or a database 46 may recognize that the user has returned battery pack or, alternately, charge the user an additional amount if the battery pack is not returned.

The battery pack 50 may include a housing 51, which may carry all elements of the battery pack 50. The battery pack 50 housing may have a chamfered edge 52 along the entirety of one edge. The chamfered edge 52 may extend between a front side and a rear side of the battery pack 50. The chamfered edge 52 may be formed by creating a flat surface with a 45-degree angle between each longitudinal side of the housing 51 between which the chamfered edge 52 extends. The kiosk 39 may have a battery pack receiver opening 31 with a corresponding chamfered opening adapted to allow the battery pack 50 to be received by the kiosk 39 in only one orientation.

The housing 51 may be waterproof. A first top portion of the housing 51 may secure to a bottom second portion of the housing 51. A seal may be seated around the housing 51 at the location where the first top portion meets the second bottom portion. The seal may be a rubber electronic seal adapted to form a waterproof union between the first top portion and the second bottom portion. The seal may prevent intrusion of water and allow the battery pack 50 to operate normally when the battery pack 50 is completely immersed I water for 30 seconds at the depth of 1 meter.

The battery pack 50 may have a plurality of electrical contacts 53 carried by the housing 51. The plurality of electrical contacts 53 may be located on an outer surface of the housing 51 and adapted to contact electrical contacts within the kiosk 39 when the battery pack 50 is retained within the kiosk 39 prior to or subsequent to dispensing. Each of the plurality of electrical contacts 53 may be an essentially flat conductive area adapted to contact another conductive surface to establish electrical communication. In one embodiment, two of the plurality of electrical contacts 53 may be adapted to receive a power supply. The two electrical contacts adapted to receive the power supply may be in electrical communication with a battery 60 carried by the housing 51. The power supply may be provided by the kiosk 39. In one embodiment, two of the plurality of electrical contacts 53 may be adapted to establish data communication with the kiosk 39. In such an embodiment, one electrical contact may be adapted to transmit data to the kiosk 39 and the other electrical contact may be adapted to receive data from the kiosk 39. Other known data transmission protocols, which may use more or less than two electrical connectors, are also contemplated and may be implemented by providing a corresponding number of electrical contacts between the battery pack 50 and the kiosk 39.

The housing 51 may carry a plurality of electrical connectors 54, 55, 56. As depicted, there are three electrical connectors. However, embodiments may include any number of electrical connectors greater than or equal to one. The number of electrical connectors included in the battery pack 50 may be limited only by the practicality of effort required to transport a battery pack 50 with large numbers of electrical connectors. The electrical connectors 54, 55, 56 may include connectors types adapted to mate with connectors commonly found on handheld, portable electronic devices. The electrical connectors may include, but are not limited to, a proprietary Apple Lightning connector 54, a micro-USB connector 55, and a 30-pin proprietary Apple brand connector 56.

The plurality of electrical connectors 54, 55, 56 may be adapted to be carried in a retained position entirely within the outline defined by the housing. The plurality of electrical connectors 54, 55, 56 may be adapted to be movably positioned with an engaging end of each of the plurality of electrical connectors 54, 55, 56 positionable external to the housing 51 in an extended position. In such a configuration, the engaging end of the electrical connector 54, 55, 56 may extend through an aperture in the housing 51. Each of the plurality of electrical connectors 54, 55, 56 may be associated with a movable control device 57, 58, 59. Each movable control device 57, 58, 59 may have an activated and a deactivated position. A linear spring 64, 65, 66 may be used to keep each movable control device 57, 58, 59 in a nominal deactivated position. An outside force may be required to move each movable control device 57, 58, 59 into the activated position. In one embodiment, the movable control device 57, 58, 59 may be a slider button. In such an embodiment, a user may exert lateral pressure on the slider button to displace the slider button to the activated position. When the lateral pressure is removed, the associated linear spring 64, 65, 66 may return the slider button to the nominal deactivated position when the linear spring 64, 65, 66 is uncompressed by the user. The movable control device 57, 58, 59 may be adapted to retain an associated electrical connector 54, 55, 56 in the retained position when the movable control device is in the deactivated position. The movable control device 57, 58, 59 may be adapted to release the electrical connector 54, 55, 56 when in the activated position. A torsion spring 61, 62, 63 may be secured to each electrical connector 54, 55, 56 and adapted to exert pressure to move the associated electrical connector 54, 55, 56 to an extended position when released by the respective movable control device 57, 58, 59. The torsion spring 61, 62, 63 may be adapted to rotate the engaging end of the associated electrical connector 54, 55, 56 through an aperture in the housing 51.

A battery 60 may be carried by the housing 51 and in electrical communication with each of the plurality of electrical connectors 54, 55, 56 and at least some of the plurality of electrical contacts 53. The battery 60 may provide an electrical power output to each of the plurality of electrical connectors 54, 55, 56. In one embodiment, the battery 60 may have a minimum capacity of 1900 mAh, a maximum input voltage of 5V DC, and a maximum input current of 2 A DC. In one embodiment, the battery 60 may have a maximum output voltage of 5V DC, a maximum output current of 2 A, and a minimum life cycle of 500. The battery 60 may be adapted to operate between 0 and 100 degrees Fahrenheit and fit within a 3.5 in×1.5 in×1.5 in envelope. The battery 60 may be rechargeable and receive a power input from the electrical contacts 53. The battery 60 may be designed to maintain 85% of its capacity when the minimum life cycle is achieved. The battery pack 50 may be designed to allow replacement of the battery 60. Such replacement may be beneficial when the battery 60 capacity has deteriorated below 85% of its original capacity.

In one embodiment, the battery pack 50 may include a charging connector 73. The charging connector 73 may be fixedly secured to the housing 51. An engaging end of the charging connector 73 may be adapted to engage a mating connector adapted to provide power to the battery pack 50 and charge the battery 60. In one embodiment, the charging connector 73 may be a micro-USB connector or the like. The charging connector 73 may be male or female. The battery 60 may be rechargeable using a wireless interface, which, by way of example and not as a limitation, may be PMA, Rezence, Qi, external electrical contacts, or the like. In one embodiment, a charged battery pack 50 may be provided to a user by a kiosk 39. The battery pack 50 may be configured to align transmitting and receiving coils when placed in compartment 36 within the kiosk 39. The kiosk 39 may be adapted to allow a single charging coil to charge a plurality of battery packs 50. The user may connect one or more of the plurality of electrical connectors 54, 55, 56 to an electronic device to charge the electronic device.

The battery pack 50 may include a circuit board 67. While the components carried by the circuit board 67 may be carried by one or more physically separate circuit boards 67, all circuit boards 67 in the battery pack 50 may be collectively referred to as a single circuit board 67. Those skilled in the art will appreciate that the circuit board 67 may be a PCB, flex circuit or the like. The circuit board 67 may include traces. The traces may include wires. The wires may connect the circuit board 67 to one or more components in the battery pack 50. The circuit board 67 may include a first set of traces 71 establishing electrical communication between at least two of the plurality of electrical contacts 53 and the battery 60. The first set of electrical traces 71 may include one trace establishing electrical communication between one of the plurality of electrical contacts 53 and a positive terminal of the battery 60. The first set of electrical traces 71 may also include a second trace establishing electrical communication between another of the plurality of electrical contacts 53 and a negative terminal of the battery 60. In embodiments including a charging connector 73, the first set of electrical traces 71 may provide electrical communication between the charging connector 73 and the battery 60 instead of or in addition to the electrical communication between the electrical contacts and the battery 60. The circuit board 67 may also include a second set of traces 72 establishing electrical communication between the battery 60 and each of the plurality of electrical connectors 54, 55, 56. The second set of traces 72 may include pairs of tracing establishing electrical communication between both the positive and negative terminals of the battery 60 and corresponding contact points on each of the electrical connectors 54, 55, 56.

The circuit board 67 may include a light emitter 68 adapted to indicate a charge level of the battery 60. The light emitter 68 may include a plurality of discrete light emitting devices. The light emitter 68 may include one or more LEDs. The light emitter 68 may energize a different number of LEDs to indicate the charge level of the battery 60. By way of example, and not as a limitation, the light emitter 68 may energize four discrete LEDs when the battery charge level is between 75% and 100%. The light emitter 68 may energize three discrete LEDs when the battery charge level is between 50% and 75%. The light emitter may energize two discrete LEDs when the battery charge level is between 25% and 50%. The light emitter may energize one discrete LED when the battery charge level is between 0% and 25%. In one embodiment, the light emitter 68 may illuminate a different color to indicate the charge level of the battery 60. By way of example, and not as a limitation, the light emitter 68 may illuminate green to indicate a charge level of the battery between 66% and 100%. The light emitter 68 may illuminate yellow to indicate a charge level of the battery between 33% and 66%. The light emitter 68 may illuminate red to indicate a charge level of the battery below 33%.

The circuit board 67 may also include a power button. The power button may extend through an aperture in the surface of the housing. The power button may be depressed to activate the flow of power from the battery 60 to any of the electrical connectors 54, 55, 56. The power button may be depressed to interrupt the flow of power from the battery 60 to any of the electrical connectors 54, 55, 56 or to the controller contained within the housing. In one embodiment, the flow of power from the battery to the electrical connectors 54, 55, 56 or to the controller contained within the housing may be automatically interrupted after a predetermined period of time.

The battery pack 50 may include an identification component 74. The identification component 74 may be secured to the housing and adapted to provide identifying information to a querying device. In one embodiment, the identification component 74 may be an NFC tag, RFID tag, or the like. The identification component 74 may operate at 13.56 MHz, 125 kHz, or other appropriate frequency. In one embodiment, the identification component 74 may be a barcode, QR code, or the like displayed on a surface of the housing 51. The kiosk 39 may be adapted to query the identification component 74 and accept only battery packs 50 with known identification information. In one embodiment, the kiosk 39 may have an access door 34, which only opens when known identifying information is detected.

The battery pack 50 may include a controller. The controller may be a microcontroller, FPGA, ASIC, processor, or the like. The controller may be configured to include a charge level circuit 70. The charge level circuit 70 may be adapted to generate an output signal indicative of the current charge level of the battery 60. The charge level output signal may be provided to the plurality of electrical contacts 53 used to transmit data from the battery pack 50. The controller may also include a variable power supply circuit 69. The variable power supply circuit 69 may be adapted to generate an output power supply having a current and voltage level to each of the plurality of electrical connectors 54, 55, 56. The voltage and current levels of the output power signal may be variable. The voltage and current levels of the output power signal provided to each electrical connector 54, 55, 56 may be different. The variable power supply circuit 69 may be configured to regulate the power level supplied to each of the electrical connectors 54, 55, 56. The variable power supply circuit 69 may be adapted to prevent power from being supplied to any or all of the electrical connectors 54, 55, 56 during periods in which no power is being drawn from the battery pack 50. The variable power supply circuit 69 may contain circuitry designed to prevent overcharging of the device being charged by the battery, over-discharge of the battery 60 providing the charge to a connected device, balancing the charge levels of individual cells within the battery 60, damage caused by short circuits, and damage caused by over temperature situations. The variable power supply circuit 69 may be designed to disconnect power to the connected device or to power down in fault situations. The variable power supply circuit 69 may be adapted to detect and provide the appropriate voltage and current level to a connected device. The variable power supply circuit 69 may be designed to protect the reverse flow of power from the connected device to the battery 60.

All connections, including, but not limited to, electrical and mechanical connections, within the battery pack 50 may be designed to withstand shock testing, including, but not limited to, 20 drop tests at a height of 5 feet.

Some of the illustrative aspects of the present invention may be advantageous in solving the problems herein described and other problems not discussed which are discoverable by a skilled artisan.

While the above description contains much specificity, these should not be construed as limitations on the scope of any embodiment, but as exemplifications of the presented embodiments thereof. Many other ramifications and variations are possible within the teachings of the various embodiments. While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best or only mode contemplated for carrying out this invention, but that the invention will include all embodiments falling within the scope of the appended claims. Also, in the drawings and the description, there have been disclosed exemplary embodiments of the invention and, although specific terms may have been employed, they are unless otherwise stated used in a generic and descriptive sense only and not for purposes of limitation, the scope of the invention therefore not being so limited. Moreover, the use of the terms first, second, etc. do not denote any order or importance, but rather the terms first, second, etc. are used to distinguish one element from another. Furthermore, the use of the terms a, an, etc. do not denote a limitation of quantity, but rather denote the presence of at least one of the referenced item.

Thus the scope of the invention should be determined by the appended claims and their legal equivalents, and not by the examples given.

That which is claimed is:

1. A battery pack device comprising:
   a housing having a chamfered edge;
   a plurality of electrical contacts carried by an outer surface of the housing;
   a plurality of electrical connectors carried within the housing;
   a moveable control device adapted to position at least one of the plurality of electrical connectors through an aperture located in the housing when activated; and
   a battery contained within the housing and in electrical communication with each of the plurality of electrical connectors and the plurality of electrical contacts.

2. The device according to claim 1 further comprising:
   a plurality of torsion springs wherein each torsion spring is secured to a respective one of the plurality of electrical connectors and adapted to rotate the respective electrical connector through the aperture when the moveable control device is activated to release the torsion spring.

3. The device according to claim 2 wherein the moveable control device is further adapted to capture at least one of the torsion springs and retain the respective electrical connector within the housing when deactivated.

4. The device according to claim 1 further comprising:
   a linear spring adapted to maintain the moveable control device in a deactivated position when the linear spring is uncompressed.

5. The device according to claim 1 further comprising:
   a circuit board comprising:
      a first set of traces in electrical communication with at least two of the plurality of electrical contacts and the battery; and
      a second set of traces in electrical communication with the battery and each of the plurality of electrical connectors.

6. The device according to claim 1 further comprising:
   a charging connector secured to the housing and in electrical communication with the battery.

7. The device according to claim 1 further comprising:
   an identification component secured to the housing and adapted to provide identifying information to a kiosk.

8. The device according to claim 1 further comprising:
   a charge level circuit adapted to generate a signal indicative of a charge level of the battery and provide the signal to the plurality of electrical contacts.

9. The device according to claim 1 further comprising a variable power supply circuit adapted to provide a variable current level and a variable voltage level to each of the plurality of electrical connectors.

10. The device according to claim 1 wherein the plurality of electrical connectors further comprises:
    a Lightning connector;
    a micro-USB connector; and
    a 30-pin connector.

11. The device according to claim 1 further comprising:
    a light emitter adapted to indicate a charge level of the battery.

12. A battery pack device comprising:
a waterproof housing having a top surface and an opposing bottom surface;
a plurality of electrical contacts carried by the bottom surface of the housing;
a first electrical connector carried within the housing;
a second electrical connector carried within the housing;
a third electrical connector carried within the housing;
a first moveable control device adapted to position the first electrical connector through a first aperture located in the housing when activated;
a second moveable control device adapted to position the second electrical connector through a second aperture located in the housing when activated;
a third moveable control device adapted to position the third electrical connector through a third aperture located in the housing when activated;
a battery contained within the housing and in electrical communication with the first electrical connector, the second electrical connector, the third electrical connector, and the plurality of electrical contacts;
a charging connector secured to the housing and in electrical communication with the battery;
an identification component secured to the housing and adapted to provide identifying information to a kiosk; and
wherein an entirety of one housing edge is chamfered.

13. The device according to claim 12 further comprising:
a first torsion spring secured to the first electrical connector and adapted to rotate the first electrical connector through the first aperture when the first moveable control device is activated to release the first torsion spring;
a second torsion spring secured to the second electrical connector and adapted to rotate the second electrical connector through the second aperture when the second moveable control device is activated to release the second torsion spring; and
a third torsion spring secured to the third electrical connector and adapted to rotate the third electrical connector through the third aperture when the third moveable control device is activated to release the third torsion spring.

14. The device according to claim 13 wherein the first moveable control device is further adapted to capture the first torsion spring and retain the first electrical connector within the housing when deactivated;
wherein the second moveable control device is further adapted to capture the second torsion spring and retain the second electrical connector within the housing when deactivated; and
wherein the third moveable control device is further adapted to capture the third torsion spring and retain the third electrical connector within the housing when deactivated.

15. The device according to claim 12 further comprising:
a first linear spring adapted to maintain the first moveable control device in a deactivated position when the first linear spring is uncompressed;
a second linear spring adapted to maintain the second moveable control device in a deactivated position when the second linear spring is uncompressed; and
a third linear spring adapted to maintain the third moveable control device in a deactivated position when the third linear spring is uncompressed.

16. The device according to claim 12 further comprising:
a circuit board comprising:
a first set of traces in electrical communication with at least two of the plurality of electrical contacts and the battery; and
a second set of traces in electrical communication with the battery, the first electrical connector, the second electrical connector, and the third electrical connector.

17. The device according to claim 12 further comprising a charge level circuit adapted to generate a signal indicative of a charge level of the battery and provide the signal to the plurality of electrical contacts.

18. The device according to claim 12 further comprising a variable power supply circuit adapted to provide a variable current level and a variable voltage level to the first electrical connector, the second electrical connector, and the third electrical connector.

19. The device according to claim 12 wherein the first electrical connector comprises a Lightning connector;
the second electrical connector comprises a micro-USB connector; and
the third electrical connector comprises a 30-pin connector.

20. A battery pack device comprising:
a waterproof housing having a top surface and an opposing bottom surface;
a plurality of electrical contacts carried by the bottom surface of the housing;
a Lightning connector carried within the housing;
a micro-USB connector carried within the housing;
a 30-pin connector carried within the housing;
a first moveable control device adapted to position the Lightning connector through a first aperture located in the housing when activated;
a second moveable control device adapted to position the micro-USB connector through a second aperture located in the housing when activated;
a third moveable control device adapted to position the 30-pin connector through a third aperture located in the housing when activated; and
a battery contained within the housing and in electrical communication with the Lightning connector, the micro-USB connector, the 30-pin connector, and the plurality of electrical contacts;
a first torsion spring secured to the Lightning connector and adapted to rotate the Lightning connector through the first aperture when the first moveable control device is activated to release the first torsion spring;
a second torsion spring secured to the micro-USB connector and adapted to rotate the micro-USB connector through the second aperture when the second moveable control device is activated to release the second torsion spring; and
a third torsion spring secured to the 30-pin connector and adapted to rotate the 30-pin connector through the third aperture when the third moveable control device is activated to release the third torsion spring;
a first linear spring adapted to maintain the first moveable control device in a deactivated position when the first linear spring is uncompressed;
a second linear spring adapted to maintain the second moveable control device in a deactivated position when the second linear spring is uncompressed; and
a third linear spring adapted to maintain the third moveable control device in a deactivated position when the third linear spring is uncompressed;

a circuit board comprising:
   a first set of traces in electrical communication with at least two of the plurality of electrical contacts and the battery, and
   a second set of traces in electrical communication with the battery, the Lightning connector, the micro-USB connector, and the 30-pin connector;
a charge level circuit adapted to generate a signal indicative of a charge level of the battery and provide the signal to the plurality of electrical contacts;
a variable power supply circuit adapted to provide a variable current level and a variable voltage level to the Lightning connector, the micro-USB connector, and the 30-pin connector;
a light emitter adapted to indicate a charge level of the battery;
a charging connector secured to the housing and in electrical communication with the battery; and
an identification component secured to the housing and adapted to provide identifying information to a kiosk;
wherein the entirety of one housing edge is chamfered;
wherein the first moveable control device is further adapted to capture the first torsion spring and retain the lightning connector within the housing when deactivated;
wherein the second moveable control device is further adapted to capture the second torsion spring and retain the micro-USB connector within the housing when deactivated; and
wherein the third moveable control device is further adapted to capture the third torsion spring and retain the 30-pin connector within the housing when deactivated.

* * * * *